United States Patent [19]
Tada

[11] 3,965,850
[45] June 29, 1976

[54] CHANNEL INDICATOR DEVICE

[75] Inventor: Siro Tada, Chigasaki, Japan

[73] Assignee: Matsushita Electric Industrial Co., Ltd., Osaka, Japan

[22] Filed: Mar. 24, 1975

[21] Appl. No.: 561,355

[30] Foreign Application Priority Data
Apr. 1, 1974 Japan.......................... 49-37665[U]
Nov. 20, 1974 Japan........................ 49-141015[U]

[52] U.S. Cl.................. 116/124.2 R; 116/DIG. 29; 116/DIG. 31; 192/71; 292/342
[51] Int. Cl.² ......................................... H03J 1/02
[58] Field of Search............ 116/DIG. 31, 124.1 R, 116/124.2 R, 124.2, 124.4, DIG. 29; 334/86, 87; 74/553; 200/336; 292/349; 192/71

[56] References Cited
UNITED STATES PATENTS
3,508,520  4/1970  Fink................................ 116/124.4
3,774,459  11/1973  Valdettaro................... 116/124.2 R FOREIGN PATENTS OR APPLICATIONS
659,054  3/1963  Canada........................ 116/DIG. 31

*Primary Examiner*—S. Clement Swisher
*Assistant Examiner*—Denis E. Corr
*Attorney, Agent, or Firm*—Stevens, Davis, Miller & Mosher

[57] ABSTRACT

A channel indicator device for a television receiver set or the like, more particularly a channel indicator device for a click stop type UHF tuner such as one having 70 detents is disclosed, in which a knurled surface is formed on an inner surface of a tube of a channel digit indicator plate and a plurality of resilient members are mounted on a tubular shaft attached to an indicator shaft, the resilient members being formed such that the knurls are adapted to gear with said knurled surface, whereby the positional offset between the channel digit and a pointer may be readily adjusted.

5 Claims, 14 Drawing Figures

CHANNEL INDICATOR DEVICE

The present invention relates to a channel indicator device for a television receiver set or the like.

In a prior art 70-detent UHF tuner of a conventional television receiver set, because of the multiplicity of the number of channel digits to be indicated, the separation between adjacent channel digits must be small when those channel digits are arranged on a single indicator disc. As a result more precise positioning between a pointer and the channel digits has been reuired.

Under such circumstances it is desirable to provide a construction which permits easy adjustment of positional offset between the pointer and the channel digits even after a channel digit plate has been assembled into a receiver set during a manufacturing process.

An example of the prior art channel indicator devices is now explained with reference to the accompanying drawings. FIGS. 1 and 2 show the construction of a conventional channel indicator device. Only a UHF channel indicator section will be explained below.

Referring to FIGS. 1 and 2, the reference numeral 1 designates a UHF channel knob, 2 a fine adjusting knob, 3 indication digits, 4 an indication digit plate having the indication digits 3 printed thereon, 5 a detent type UHF tuner, and 6 a transparent lens positioned in front of the indication digit plate 4 having a pointer 6a printed or otherwise formed thereon. 7 designates a main shaft of the UHF tuner 5, 8 a fine adjusting shaft, 9 an indicator shaft to which the indication digit plate 4 is attached.

In such a construction, as the channel knob 1 is rotated the indication digit plate 4 is rotated digit by digit through the main shaft 7 and the indicator shaft 9.

FIGS. 3a and 3b show a prior art method of mounting the indication digit plate 4 to the indicator shaft 9. An axial slot 4b is formed in a tubular portion 4a of the indication digit plate 4 to impart flexibility to the tubular portion 4a. Then a ring spring 10 is fitted on an outer periphery of the tubular portion 4a to prevent the slip between the indication digit plate 4 and the indicator shaft 9 in the direction of rotation by the spring force of the ring spring 10. In the construction of FIGS. 3a and 3b, however, there is a drawback in that when a fine adjustment between the position of the indication digits 3 and the position of the pointer 6a, is to be made, a large slip torque is required in view of the rotational inertia force of the indication digit plate 4, rendering the adjustment operation difficult.

Although not shown in the drawing, it is possible to adjust the positioning of the indication digits 3 by forming a knurl on an inner surface of the tubular portion 4a of the indication digit plate 4 and a knurl adapted to gear with the knurl on the indication digit plate 4, on the indicator shaft 9 and change the gearing position of both knurls. In this case, however, it is necessary to remove the indication digit plate 4 from the indicator shaft 9 and reinsert it. This brings about a drawback in that the operation is troublesome and accurate adjustment may not be accomplished.

The present invention is intended to overcome the above disadvantages of the prior art and provide a channel indicator device wherein an indicator tubular shaft is provided between the indication digit plate formed with the knurl and the indicator shaft, and a plurality of resilient members formed with a knurl adapted to in gear with the knurl on the indication digit plate, the members being on the indicator tubular shaft.

It is a first object of the present invention to enable the position adjustment of the indication digits without requiring the removal of the indication digit plate.

It is a second object of the present invention to insure reliable positioning and fixing of the indication digit plate relative to the indicator tubular shaft by the engagement of the knurl on the indication digit plate and the indicator tubular shaft.

It is a third object of the present invention to reduce the displacement of the resilient members by tapering the knurl formed in the resilient members of the indicator tubular shaft.

It is a fourth object of the present invention to allow smoother rotation of the indication digit plate during the adjustment of the indication digits by forming shoulders on the resilient members, which shoulders are taller than the knurl.

Those and other objects, features and advantages of the present invention will become more apparent from the following detailed description of the preferred embodiment of the present invention when taken in conjunction with the accompanying drawings, in which.

The preferred embodiment of the present invention is now described.

Figure 1:
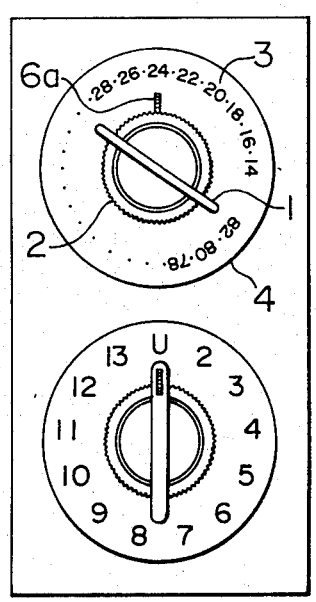
FIG. 1 is a front view of a conventional VHF/UHF channel indicator device.
Figure 2:
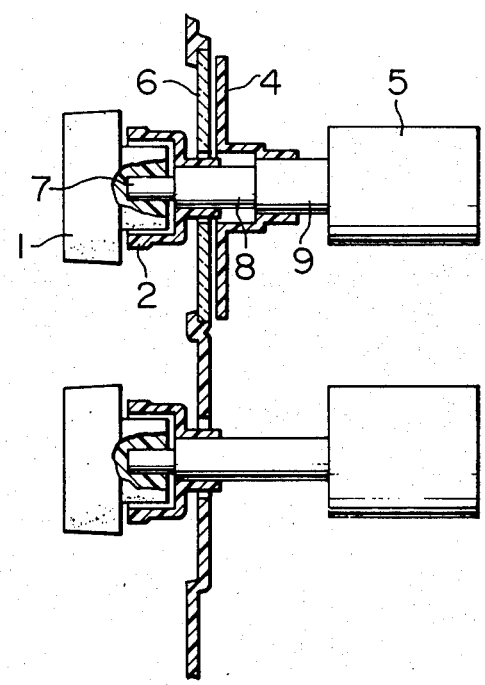
FIG. 2 shows a side elevational cross section of the channel indicator device of FIG. 1.
Figure 3A:
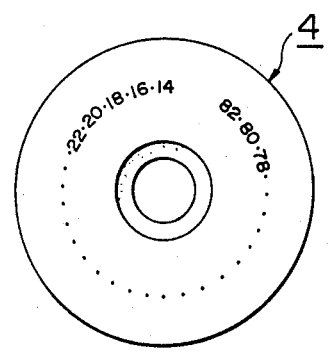
FIG. 3a shows a front view of a channel digit plate in a prior art channel indicator device.
Figure 3B:
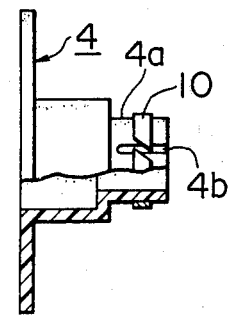
FIG. 3b shows a side elevational view, partly in section, of the device of FIG. 1.
Figure 4:
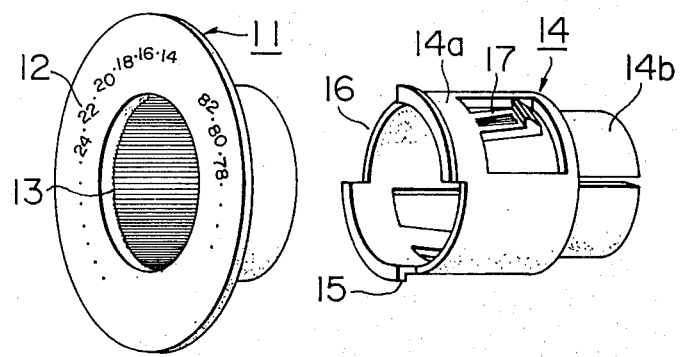
FIG. 4 is an exploded perspective view of a channel indicator device in one embodiment of the present invention.
Figure 5:
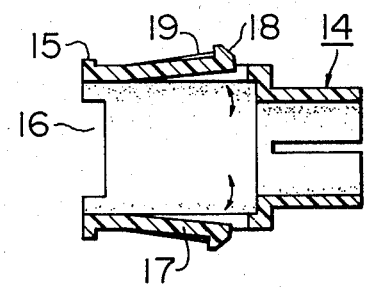
FIG. 5 shows a sectional view of an indicator tubular shaft shown in FIG. 4.

Referring to FIGS. 4 and 5, the reference numeral 11 designates an indication digit plate on a front side of which there are arranged channel digits 12 from 14 to 82. The even numbers are indicated by digits while odd numbers are indicated by dots. The indication digit plate 11 is formed with a knurl 13 on an inner surface of its tubular portion except a portion facing a disc portion. The pitch of the knurl 13 is smaller than the pitch of the arrangement of the indication digits 12. Thus there is formed a shoulder between the knurl 13 and the inner surface. 14 designates an indicator tubular shaft made of plastic material which consists of a large diameter portion 14a to be fitted to the tubular portion of the indication digit plate 11 and a smaller diameter portion 14b to be fitted to an indicator shaft 9 shown in FIG. 2. Formed at a peripheral end of the larger diameter portion 14a is a first stop 15 which has a partial cutout 16. 17 designates a pair of opposing resilient members each having a second stop 18 formed at a free end thereof and a tapered knurl 19 formed thereon. The height of the knurl 19 decreases as it goes towards, i.e., in a direction towards, its support point.

When the indicator tubular shaft 14 is inserted into the tubular portion of the indication digit plate 11 with the smaller diameter portion 14b at its leading end, the tapered surfaces of the second stops 18 on the resilient members 17 abut against the end of the tubular portion so that the insertion into the tubular portion is carried out relatively smoothly.

Figure 6:
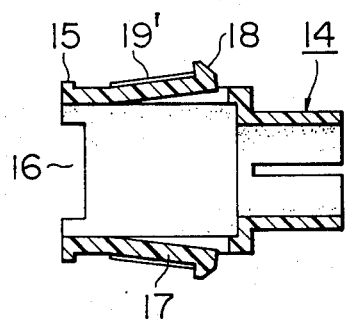
FIG. 6 shows a sectional view illustrating a modification of the indicator tubular shaft.

FIG. 6 shows a modification of the indicator tubular shaft 14. The difference of the present modification tubular shaft 14 shown in FIGS. 4 and 5 resides in that a knurl 19' of the resilient member 17 is not tapered but instead it has a constant height from one end to the other end. With this construction, the movable range of the resilient member 18 should be designed larger.

Figure 7:
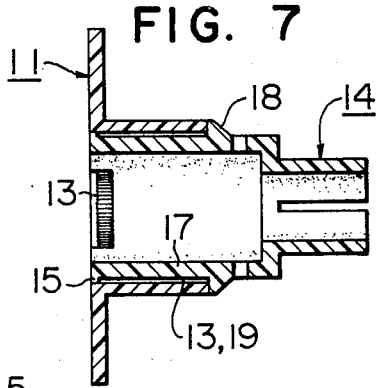
FIG. 7 shows a sectional view illustrating the fitting of the indication digit plate and the indicator tubular shaft.

FIG. 7 shows the indication digit plate 11 to which the indicator tubular shaft 14 is fitted. The knurl 13 and the knurl 19 gear with each other and the second stops 18 abut against the end of the tubular portion, and the first stop 15 engages with the shoulder formed by the knurl 13 to position the indication digit plate 11, which in turn is fixed to the tubular shaft 14.

Figure 8:
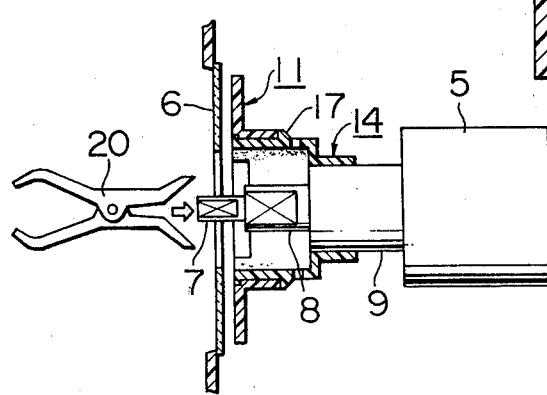
FIG. 8 illustrates a manner of adjusting the indication digit plate.

FIG. 8 shows an illustrative manner by which the position of the indication digit plate 11 is adjusted. In FIG. 8 the channel knob 1 and the fine adjustment knob 2 have been removed from the main shaft 7 and the fine adjustment shaft 8. After the assembly of a television receiver set, if there occurs a misalignment between the pointer 6a and the channel digits 12 by an offset of the main shaft 7 or an offset of the indication digit plate 11, the channel knob 1 and the fine adjustment knob 2 are removed and a jig 20 is inserted into the transparent panel 6. The indication digit plate 11 is rotated by the jig 20 while it is kept pressed by the jig 20 from the inside. In this manner the position adjustment of the channel digits 12 with respect to the pointer 6a is carried out. Although the knurls 13 and 19 gear with each other the indication digit plate 11 may be rotated because the resilient member 17 can be swung.

With the above arrangement it is thus possible to rotate the indication digit plate 11 without removing the same so that the operation is facilitated and the positional adjustment of the indication digits 12 with respect to the pointer 6a can be accurately performed.

Figure 9:
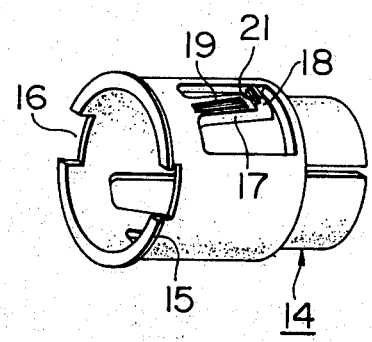
FIG. 9 is a perspective view illustrating a further modification of the indicator tubular shaft.
Figure 10:
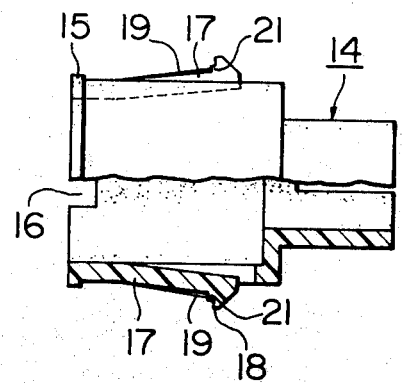
FIG. 10 shows a side elevational view, partly in section, of the indicator tubular shaft shown in FIG. 9.

FIGS. 9 and 10 shows another modification of the indicator tubular shaft. Since the present modification is similar to that shown in FIGS. 4 and 5 except for the structure of the resilient member 17, the same reference numerals are used to designate corresponding parts. In the present modification, between the tapered knurl 19 and the second stop 18 a shoulder 21 which is taller than the knurl 19 and lower than the second stop 18 is formed. This shoulder 21 serves to release the engagement of the knurls 13 and 19.

Figure 11:
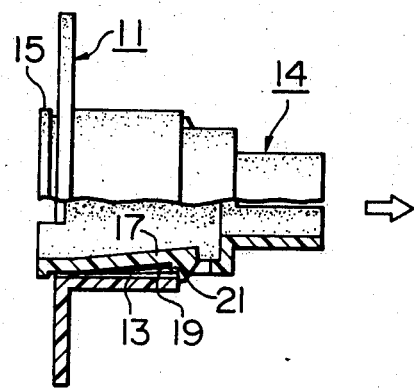
FIG. 11 is a side elevational view, partly in section, showing the indication digit plate fitted to the shoulder on the indicator tubular shaft of FIG. 9.

FIG. 11 shows the disengaged position of the knurl 13 of the indication digit plate 11 and the knurl 19 of the indicator tubular shaft 14. In this figure, the knurl 13 of the indication digit plate 11 rides on the shoulder 21 of the resilient member 17. Therefore, the knurl 13 of the indication digit plate 11 does not gear with the knurl 19 of the resilient member 17. Thus, the indication digit plate 11 can be rotated in the direction of its rotation with a minimum torque so that the positional adjustment between the indicator character 12 and the pointer 6a is facilitated.

Figure 12:
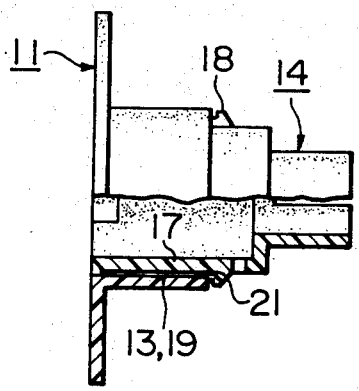
FIG. 12 is a side elevational view, partly in section, showing the indication digit plate geared with the knurl on the indicator tubular shaft.

FIG. 12 shows the engaged position of the knurl 13 of the indication digit plate 11 and the knurl 19 of the resilient member 17. By moving the indicator tubular shaft 14, which has been positionally adjusted and is in the position shown in FIG. 11, in the direction shown by the arrow, the knurl 13 is disengaged from the shoulder 21 and the knurl 13 gears with the knurl 19. The indication digit plate 11 is positioned and fixed by the first stop 15, the knurl 13 and the shoulder 21. That is, the indicator digit plate 11 is prevented from rotating by the engagement of the knurls 13 and 19.

Figure 13:
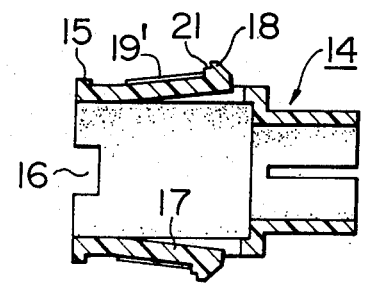
FIG. 13 shows a sectional view of still a further modification of the indicator tubular shaft.

FIG. 13 shows a further modification of the present invention. In the present modification, the knurl 19' of the indicator tubular shaft 14 having the shoulder 21 formed thereon as shown in FIGS. 9 and 10 is not tapered but has a constant height from one end to the other end. In this case, since the height of the knurl 19' is higher than that of FIGS. 9 and 10 at the fixed end of the resilient member 17, the height of the shoulder 21 which serves to release the engagement of the knurls should be increased. Thus, the displacement of the resilient member 17 is large compared with the structure shown in FIGS. 9 and 10, in which since the height of the knurl 19 may be reduced as it goes toward the fixed end of the resilient member 17 to form a tapered structure the height of the shoulder can be reduced to allow the reduction of the displacement of the resilient member 17.

What is claimed is:

1. A channel indicator device comprising a first indicator shaft linked to a channel knob for rotation therewith, a second indicator tubular shaft having a plurality of resilient members each having a knurl formed thereon, said second indicator tubular shaft being mounted on said first indicator shaft, and an indication digit plate having a knurl adapted to gear with said knurls on said resilient members formed thereon and having channel digits arranged thereon.

2. A channel indicator device according to claim 1, wherein said knurls on said resilient members are tapered so that the height thereof decreases in a direction towards a fixed end of the resilient members.

3. A channel indicator device according to claim 1, wherein stops are formed at an end of said second indicator tubular shaft and ends of said resilient members, respectively, and a shoulder is formed on said indication digit plate by the knurl thereof, and the indication digit plate is positioned with respect to the second indicator tubular shaft and fixed thereat by the engagement of said stops of said indicator tubular shaft and said shoulder formed by said knurl and the engagement of said stops of said resilient members and said indication digit plate.

4. A channel indicator device according to claim 1, wherein said resilient members are each provided with means for releasing the engagement of the knurl on said indication digit plate and the knurls on said resilient members.

5. A channel indicator device according to claim 4, wherein stops are formed at ends of said resilient members, and wherein said engagement releasing means includes a shoulder which is higher than said knurls on said resilient members and lower than said stops, said shoulder being located between said knurls on said resilient members and said stops.

* * * * *